(12) United States Patent
Anderson et al.

(10) Patent No.: US 7,745,909 B2
(45) Date of Patent: Jun. 29, 2010

(54) LOCALIZED TEMPERATURE CONTROL DURING RAPID THERMAL ANNEAL

(75) Inventors: Brent A. Anderson, Jericho, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 275 days.

(21) Appl. No.: 11/678,799

(22) Filed: Feb. 26, 2007

(65) Prior Publication Data
US 2008/0203524 A1 Aug. 28, 2008

(51) Int. Cl.
*H01L 21/762* (2006.01)
*H01L 21/70* (2006.01)
(52) U.S. Cl. .............. 257/638; 257/424; 257/510; 257/532; 257/E29.001; 257/E21.54
(58) Field of Classification Search .......... 257/510, 257/532, 638, 424, E29.001, E21.54
See application file for complete search history.

(56) References Cited

U.S. PATENT DOCUMENTS

| 4,525,380 | A | 6/1985 | Arai et al. |
|---|---|---|---|
| 5,523,262 | A | 6/1996 | Fair et al. |
| H1637 | H | 3/1997 | Offord et al. |
| 5,841,110 | A | 11/1998 | Nenyei et al. |
| 5,897,381 | A | 4/1999 | Aronowitz et al. |
| 5,956,603 | A | 9/1999 | Talwar et al. |
| 6,262,435 | B1 | 7/2001 | Plat et al. |
| 6,300,243 | B1 | 10/2001 | Thakur |
| 6,403,923 | B1 | 6/2002 | Tay et al. |
| 6,414,364 | B2 | 7/2002 | Lane et al. |
| 6,569,720 | B2 | 5/2003 | Kunii |
| 6,665,858 | B2 | 12/2003 | Miyazaki |
| 6,812,550 | B1 * | 11/2004 | En et al. ............. 257/629 |

(Continued)

FOREIGN PATENT DOCUMENTS

CN   1682358 A   10/2005

(Continued)

OTHER PUBLICATIONS

Laviron, et al., "Intra-Die Temperature Non Uniformity Related to Front Side Emissivity Dependence During Rapid Thermal Annealing," 203$^{rd}$ ECS Meeting, Paris, Apr. 27-May 2, 2003, Paper#880, pp. 1-9.

(Continued)

*Primary Examiner*—Fernando L Toledo
*Assistant Examiner*—John P Dulka
(74) *Attorney, Agent, or Firm*—Gibb I.P. Law Firm, LLC

(57) ABSTRACT

Disclosed are embodiments of a semiconductor structure and method of forming the structure with selectively adjusted reflectance and absorption characteristics in order to selectively control temperature changes during a rapid thermal anneal and, thereby, to selectively control variations in device performance and/or to selectively optimize the anneal temperature of such devices. Selectively controlling the temperature changes in different devices during a rapid thermal anneal is accomplished by selectively varying the isolation material thickness in different sections of a shallow trench isolation structures. Alternatively, it is accomplished by selectively varying the pattern of fill structures in different sections of a semiconductor wafer so that predetermined amounts of shallow trench isolation regions in the different sections are exposed.

20 Claims, 6 Drawing Sheets

U.S. PATENT DOCUMENTS

| | | | |
|---|---|---|---|
| 6,867,080 B1 * | 3/2005 | Paton et al. | 438/183 |
| 6,875,623 B2 | 4/2005 | Niwayama et al. | |
| 6,916,690 B2 * | 7/2005 | Chang | 438/149 |
| 7,344,929 B2 | 3/2008 | Mehrotra et al. | |
| 2004/0033666 A1 | 2/2004 | Williams et al. | |
| 2004/0077149 A1 | 4/2004 | Renau | |
| 2004/0084427 A1 | 5/2004 | Talwar et al. | |
| 2004/0188801 A1 * | 9/2004 | Ehrichs | 257/532 |
| 2004/0195626 A1 | 10/2004 | Yamada et al. | |
| 2004/0259387 A1 | 12/2004 | Yamazaki et al. | |
| 2005/0003638 A1 | 1/2005 | Stolk | |
| 2005/0009344 A1 | 1/2005 | Hwang et al. | |
| 2005/0059224 A1 | 3/2005 | Im | |
| 2005/0085047 A1 | 4/2005 | DeLoach et al. | |
| 2005/0173802 A1 * | 8/2005 | Tabara et al. | 257/758 |
| 2005/0189340 A1 | 9/2005 | Talwar et al. | |
| 2005/0191044 A1 | 9/2005 | Aderhold et al. | |
| 2006/0099745 A1 | 5/2006 | Hsu et al. | |
| 2006/0154475 A1 * | 7/2006 | Mehrotra et al. | 438/636 |
| 2006/0228897 A1 * | 10/2006 | Timans | 438/758 |
| 2007/0230553 A1 | 10/2007 | Talbot et al. | |

FOREIGN PATENT DOCUMENTS

| | | |
|---|---|---|
| DE | 10329212 | 1/2005 |
| JP | 06-295923 | 10/1994 |
| RU | 2 206 141 C1 | 6/2003 |
| WO | WO 93/19484 | 9/1993 |
| WO | 2007038575 | 4/2007 |

OTHER PUBLICATIONS

Anderson et al., U.S. Appl. No. 11/678,783, Office Action Communication, Apr. 30, 2009, 12 Pages.

Anderson et al., U.S. Appl. No. 11/678,745, BUR920060023US1, Office Action Communication, May 13, 2009, 19 pages.

Anderson et al., U.S. Appl. No. 11/869,768, BUR920060023US2, Office Action Communication, May 14, 2009, 26 pages.

Anderson et al., U.S. Appl. No. 11/678,756, BUR920060024US1, Office Action Communication, Aug. 31, 2009, 6 pages.

PCT International Search Report and Written Opinion dated Aug. 27, 2009, pp. 1-12.

Anderson et al., U.S. Appl. No. 11/869,768, BUR920060023US2, Office Action Communication, Nov. 24, 2009, 5 pages.

Anderson et al., U.S. Appl. No. 11/678,745, BUR920060023US1, Notice of Allowance, Nov. 18, 2009, 10 pages.

* cited by examiner

LOCALIZED TEMPERATURE CONTROL DURING RAPID THERMAL ANNEAL

BACKGROUND

1. Field of the Invention

The embodiments of the invention generally relate to semiconductor wafers and, more particularly, to semiconductor wafer structures and methods of forming the structures that optimize variations in reflectance and absorption characteristics.

2. Description of the Related Art

Semiconductor wafer fabrication often involves the use of a rapid thermal anneal (RTA) process to affect the electrical properties of active devices on the wafer. More specifically, an RTA process can be used to activate dopants, diffuse dopants, re-amorphize structures, repair damage from ion implantation processes, etc. RTAs are typically performed by powerful halogen lamp-based heating equipment or lasers which direct radiation onto a wafer surface in order to change the wafer temperature. However, variations in the reflectance and absorption in different regions of a wafer can result in non-uniform temperature changes across the wafer during thermal anneal processes. These non-uniform temperature changes can result in temperature variations on the wafer of 10° C. or more.

Variations in reflectance and absorption characteristics can be caused by a variety of different factors including, different materials, the patterns of those materials in different regions of a wafer and the thicknesses of those materials in different regions of the wafer. For example, dielectric materials (e.g., silicon dioxide ($SiO_2$)) in shallow trench isolation structures have different reflectance and absorption characteristics than semiconductor materials (e.g., silicon or silicon germanium) incorporated into devices. Dense regions of a wafer (i.e., regions of a wafer having a high number of devices) will have a higher silicon to silicon dioxide ratio than less dense regions. Different silicon-to-silicon dioxide ratios in different regions of the wafer will result in non-uniform temperature changes during a RTA. These non-uniform temperature changes can cause variations in dopant activation, damage repair, etc. across the wafer and can, thereby, cause variations in threshold voltages, sheet resistances, drive currents, leakage currents, etc. between devices on different regions of the wafer. Thus, non-uniform temperature changes can cause significant, location-dependent, variations in device performance.

Furthermore, as technologies continue to scale, anneal ramp times will continue to decrease (e.g., to sub-second ramps) and these faster ramp times will be accompanied by an even greater sensitivity to variations in reflectance and absorption characteristics across a wafer.

SUMMARY

Disclosed herein are embodiments of a semiconductor structure and method of forming the structure with selectively adjusted reflectance and absorption characteristics in order to selectively control temperature changes (i.e., the maximum anneal temperature that will be achieved in different regions) during a single rapid thermal anneal and, thereby, to selectively control variations in device performance (e.g., to form devices with different threshold voltages (Vt) in different regions on the same wafer) and/or to selectively optimize the anneal temperature of such devices (e.g., to ensure optimal activation temperatures for n-type and p-type dopants during anneals). Selectively controlling the temperature changes in different devices during a rapid thermal anneal can be accomplished by selectively varying the isolation material thickness in different sections of a shallow trench isolation structures (e.g., in sections that are adjacent to different devices). Alternatively, it can be accomplished by selectively varying the pattern of fill structures in different sections of a semiconductor wafer so that predetermined amounts of shallow trench isolation regions in the different sections are exposed.

More particularly, one embodiment the semiconductor structure comprises a substrate, an insulator layer on the substrate, and both a first film and a second film above the insulator layer. Specifically, the first film comprises a first material (e.g., a single crystalline semiconductor material such as silicon). Additionally, devices (e.g., at least one first device and at least one second device) can be formed in this first film. The second film comprises a second material that is also above the insulator layer such that it is positioned laterally adjacent to the first film. The second material can comprise an isolation material (e.g., an oxide and/or a nitride material). For example, the second material can comprise the same dielectric material as the insulator layer.

The second film can further comprise a first section with a first thickness adjacent to a first device in the first film. The second film can also comprise a second section with a second thickness adjacent to a second device in the first film. The second thickness of the second section can be different from the first thickness of the first section. These first and second thicknesses can be predetermined to control reflectance and absorption characteristics in the area of the first film that contains the first device(s) and in the area of the first film that contains the second device(s), respectively. Specifically, the first and second thicknesses are predetermined so that the first device(s) and the second device(s) can achieve predetermined maximum temperatures during a single rapid thermal anneal process so that optimal dopant activation temperatures are achieved and/or so that the first device(s) and the second device(s) will exhibit predetermined performance characteristics following a rapid thermal anneal.

Also disclosed is an embodiment of a method of forming the semiconductor structure, described above. This embodiment comprises providing a substrate and forming an insulator layer on the substrate. A first film is formed on the insulator layer. This first film can comprise a first material, for example, a single crystalline semiconductor material such as silicon. Thus, the first film can correspond to a device region of the semiconductor structure. A second film, comprising a second material that is different from the first material, is also formed on the insulator layer adjacent to the first film. The second material can comprise an isolation material (e.g., an oxide and/or nitride material) and can, for example, comprise the same dielectric material as the insulator layer (e.g., silicon dioxide). Thus, the second film can correspond to an isolation region (e.g., a shallow trench isolation region) of the semiconductor structure. The second film is specifically formed with a first section having a first thickness and a second section having a second thickness that is different from the first thickness.

Prior to formation of the semiconductor structure, the desired first and second thicknesses of the first and second sections, respectively, of the second film (i.e., a shallow trench isolation region) are predetermined so as to selectively control reflectance and absorption characteristics in areas of the first film adjacent to the different sections of the second film. Specifically, the first and second thicknesses are predetermined so that subsequently formed first device(s) in the first film adjacent to the first section of the second film and subsequently formed second device(s) in the first film adjacent to the second section of the second film will be able to achieve predetermined maximum temperatures during a single rapid thermal anneal process so that optimal dopant activation temperatures are achieved and/or so that the devices will exhibit predetermined performance characteristics following the rapid thermal anneal.

To form the second film with different thicknesses in different section, the second material is planarized after it is deposited. Then, the first film, the second film or neither is etched back as necessary so that the desired first thickness is achieved. Then, a photoresist layer can be deposited over the structure and lithographically patterned to expose a portion of the second film. Next, the exposed portion of the second film can be etched back to the desired second thickness.

Following formation of the first and second films above the insulator layer, at least one first device can be formed in the first film adjacent to the first section of the second film and at least one second device can be formed in the first film adjacent to the second section of the second film.

In another embodiment the semiconductor structure comprises a first section and a second section. The first section comprises at least one first device and a first isolation region adjacent to the first device(s). The second section similarly comprises at least one second device and a second isolation region adjacent to the second device(s). Both sections also comprise a plurality of fill structures that are positioned in predetermined patterns so that only predetermined amounts of the isolation material of the isolation regions are exposed. These fill structures can comprise, for example, single crystalline semiconductor structures positioned laterally adjacent to the first and second isolation regions, polycrystalline semiconductor structures positioned above the first and second isolation regions, and/or dielectric structures positioned above the first and second isolation regions. The first amount of the isolation material of the first isolation region that is exposed in the first section and the second amount of the isolation material of the second isolation region that is exposed in the second section are each predetermined so that the first device and the second device achieve predetermined maximum temperatures during a rapid thermal anneal process in order to achieve optimal dopant activation temperatures (e.g., different predetermined dopant activation temperatures) and/or so that the first device and the second device will exhibit predetermined performance characteristics following the rapid thermal anneal (e.g., the same or different predetermined performance characteristics).

Also disclosed is an embodiment of a method of forming the semiconductor structure, described above. This embodiment comprises providing a substrate (e.g., a semiconductor wafer) and forming on the substrate a first section with at least one first device and a first isolation region adjacent to the first device(s) and a second section with at least one second device and a second isolation region adjacent to the second device(s).

Fill structures are also formed in the first and second sections. Specifically, the fill structures can be formed in each of the sections and can be formed in predetermined patterns so that a first amount of the isolation material in the first isolation region of the first section will be exposed and similarly so that a second amount of the isolation material in the second isolation region of the second section will be exposed. The first and second amounts of exposed isolation material in the first and second sections, respectively, are predetermined so that the first and second devices will each achieve predetermined maximum temperatures during a rapid thermal anneal so that the devices are subjected to optimal dopant activation temperatures during a rapid thermal anneal and/or so that the first and second devices exhibit predetermined performance characteristics following the rapid thermal anneal (e.g., the same or different threshold voltages).

This method embodiment, as described above, illustrates the fill structures being formed such that the first and second patterns are achieved in the first and second sections, respectively. However, alternatively, a generic wafer with a surplus of fill structures can be formed. Then specific fill structures can be selectively removed from different sections of the wafer in order to achieve the predetermined patterns, described above. If a generic wafer with a surplus of fill structures is used, but not enough fill structures are present in a particular section, additional fill structures can also be formed, as necessary, in order to achieve the predetermined patterns.

Fill structures can be formed by forming single crystalline semiconductor structures so that they are positioned laterally adjacent to the first and second isolation regions in the first and second sections, respectively. Fill structures can also be formed by forming polycrystalline semiconductor structures above the first and second isolation regions in the first and second sections, respectively. Finally, fill structures can also be formed by forming dielectric structures above the first and second isolation regions in the first and second sections, respectively.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF PREFERRED EMBODIMENTS

Figure 1:
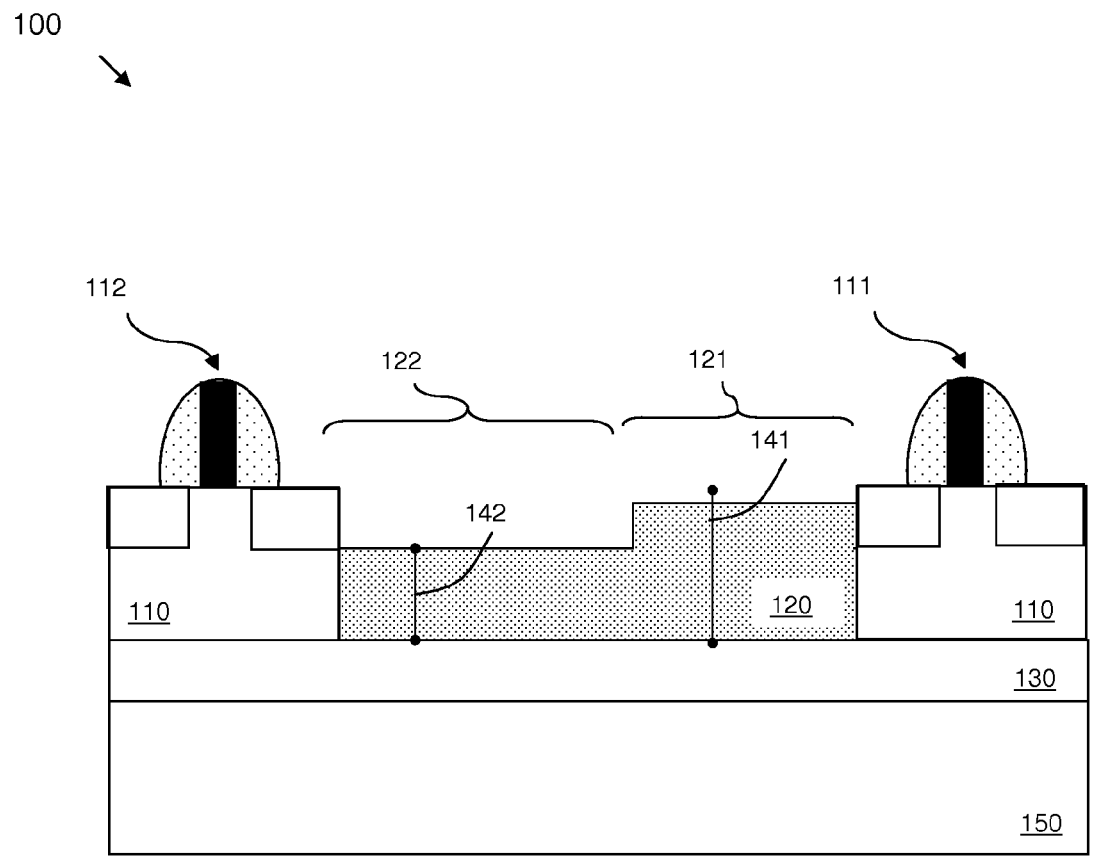
FIG. 1 is a schematic diagram illustrating an embodiment of a semiconductor structure of the invention.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned above, variations in reflectance and absorption characteristics can be caused by a variety of different factors including, different materials, the patterns of those materials in different regions of a wafer and the thicknesses of those materials in different regions of the wafer. For example, dielectric materials (e.g., silicon dioxide ($SiO_2$)) in shallow trench isolation structures have different reflectance and absorption characteristics than semiconductor materials (e.g., silicon or silicon germanium) incorporated into devices. These different reflectance characteristics can result in non-uniform temperature changes across the wafer during a rapid thermal anneal (RTA) process. Non-uniform temperature changes can cause variations in dopant activation, damage repair, etc. across the wafer and can, thereby, cause variations in threshold voltages, sheet resistances, drive currents, leakage currents, etc. between devices on different regions of the wafer. Thus, non-uniform temperature changes can cause significant, location-dependent, variations in device performance. It would be advantageous over the prior art to provide a wafer structure with pre-determined variations in reflectance and absorption characteristics in order to control temperature changes during a rapid thermal anneal and, thereby, to selectively control variations in device performance. For example, it would be advantageous over the prior art to selectively vary the reflectance and absorption characteristics in different regions of a wafer in order to either selectively vary the performance of devices in different regions on the same wafer (e.g., to form devices with different threshold voltages (Vt) in different regions on the same wafer) and/or to selectively vary the anneal temperature of such devices (e.g., to ensure optimal activation temperatures for n-type and p-type dopants during anneals).

In view of the foregoing, disclosed herein are embodiments of a semiconductor structure and method of forming the structure with selectively adjusted reflectance and absorption characteristics in order to selectively control temperature changes during a rapid thermal anneal (i.e., to control the maximum temperature achieved in different regions or at different devices during a rapid thermal anneal) and, thereby, to selectively control variations in device performance (e.g., to form devices with the same or different threshold voltages (Vt) in different regions on the same wafer) and/or to selectively optimize the anneal temperature of such devices (e.g., to ensure optimal activation temperatures for n-type and p-type dopants during anneals). Selectively controlling the temperature changes in different devices during a rapid thermal anneal can be accomplished by selectively varying the isolation material thickness in different sections of a shallow trench isolation structures (e.g., in sections that are adjacent to different devices). Alternatively, it can be accomplished by selectively varying the pattern of fill structures in different sections of a semiconductor wafer so that predetermined amounts of shallow trench isolation regions in the different sections are exposed.

More particularly, referring to FIG. 1, one embodiment the semiconductor structure 100 comprises a substrate 150 (e.g., a semiconductor wafer), an insulator layer 130 on the substrate 150, and both a first film 110 and a second film 120 above the insulator layer 130. Specifically, the first film 110 comprises a first material. The first material can comprise a semiconductor (e.g., a single crystalline semiconductor material such as silicon). Additionally, devices (e.g., at least one first device 111 and at least one second device 112) can be formed in this first film 110. Thus, the first film 110 can correspond to a device region of the semiconductor structure 100. The second film 120 comprises a second material that is also above the insulator layer 130 such that it is positioned laterally adjacent to the first film 110. The second material can comprise an isolation material (e.g., an oxide and/or a nitride material). For example, the second material can comprise the same dielectric material as the insulator layer 130 (e.g., silicon dioxide). Thus, the second film 120 can correspond to an isolation region (e.g., a shallow trench isolation region) of the semiconductor structure 100.

The second film 120 can further comprise a first section 121 adjacent to the first device(s) 111 in the first film 110. This first section 121 can have a predetermined first thickness 141. The second film 120 can also comprise a second section 122 adjacent to the second device(s) 112 in the first film 110. This second section 122 can have a predetermined second thickness 142 that is different from the first thickness 141 of the first section 121. These first and second thicknesses 141, 142 can be predetermined in order to control reflectance and absorption characteristics in an area of the first film 110 that contains the first device(s) 111 and that is adjacent to the first section 121 of the second film 120 and also to control the reflectance and absorption characteristics in an area of the first film 110 that contains the second device(s) 112 and that is adjacent to the second section 122 of the second film 120. Although FIG. 1 illustrates both the first thickness 141 of the first section 121 of the second film 120 and the second thicknesses 142 of the second section 122 of the second film 120 as being less than the thickness of the first film 110, it is anticipated that either one or both of these thicknesses 141, 142 may alternatively be the same or greater than that of the first film 110.

More specifically, the first and second thicknesses 141, 142 are predetermined so that the first device(s) 111 and the second device(s) 112 can achieve predetermined maximum temperatures during a rapid thermal anneal process. The maximum temperature achievable at the different devices can be predetermined in order to ensure that optimal dopant activation temperatures are achieved. For example, it is well-known in the art that different dopants (e.g., n-type dopants such as phosphorous (P), antimony (Sb), and arsenic (As) and p-type dopants such as boron (B)) have different activation temperatures. Therefore, to optimize the dopant activation, the thicknesses 141, 142 of different sections 121, 122 of STI 120 adjacent to devices 111, 112 with different dopants can be selectively adjusted. Selectively varying the STI thickness in different sections can be used to selectively vary the anneal temperatures of adjacent devices and, thus, to vary the temperature at which the dopants in those device are activated.

Alternatively or additionally, the maximum temperature achievable at the different devices can be predetermined so that the first and second devices will exhibit predetermined performance characteristics following a rapid thermal anneal. For example, it is well known that different anneal temperatures can cause devices to exhibit different threshold voltages, sheet resistances, drive currents, leakage currents, etc. Therefore, in order to selectively control the performance characteristics of different devices (e.g., the threshold voltages, sheet resistances, drive currents, leakage currents, etc. of different devices), the thicknesses 141, 142 of different sections 121, 122 of STI 120 adjacent to those different devices 111, 112 can be selectively adjusted. By selectively varying the thickness 142 of a section 122 of STI 120 adjacent to a given device 112 the performance of that device 112 can be selectively varied as compared to the performance of a different device 111 adjacent to a different section 121 of STI 120 with a different thickness 141.

Figure 2:
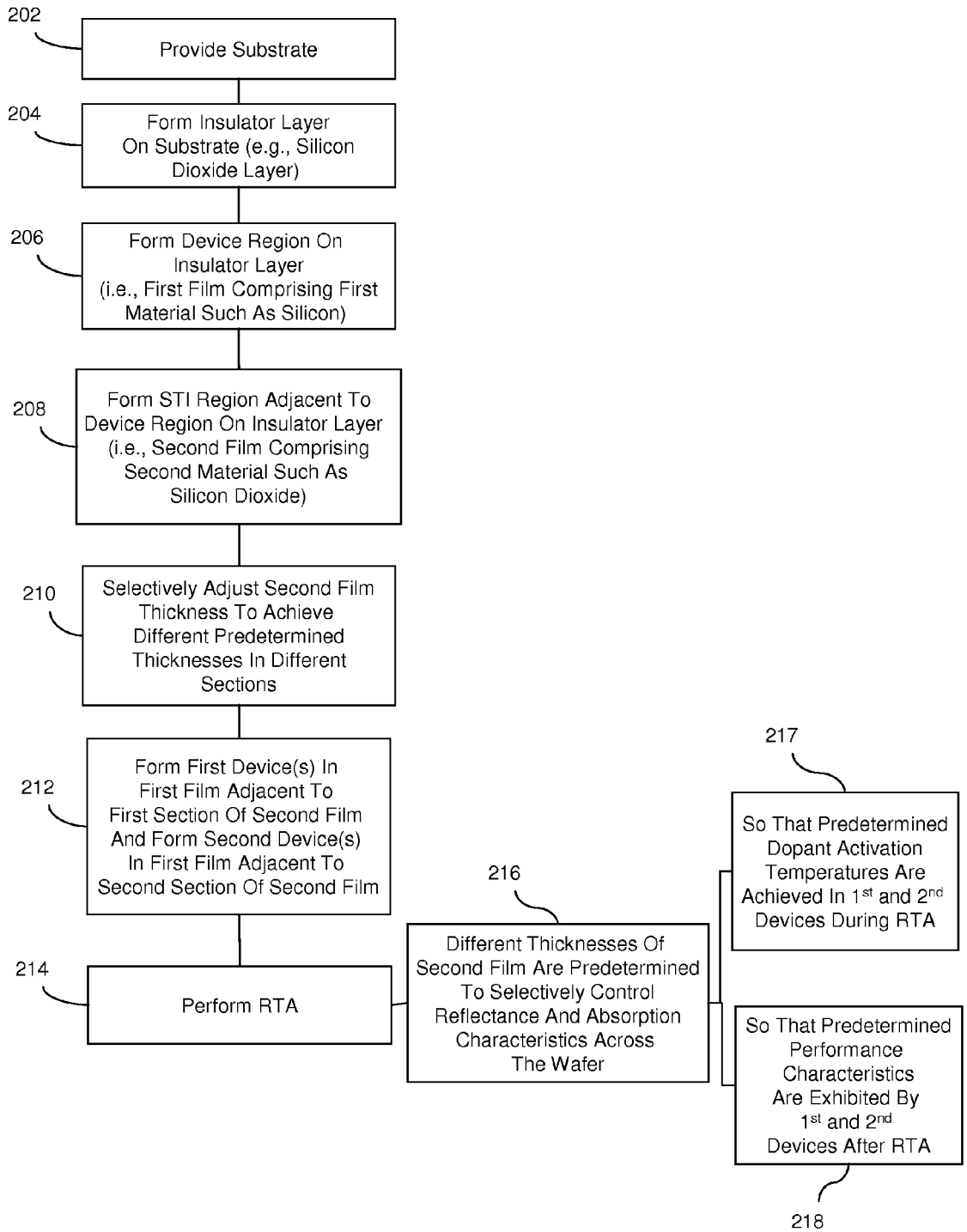
FIG. 2 is a flow diagram illustrating an embodiment of a method of forming the semiconductor structure of FIG. 1.
Figure 4:
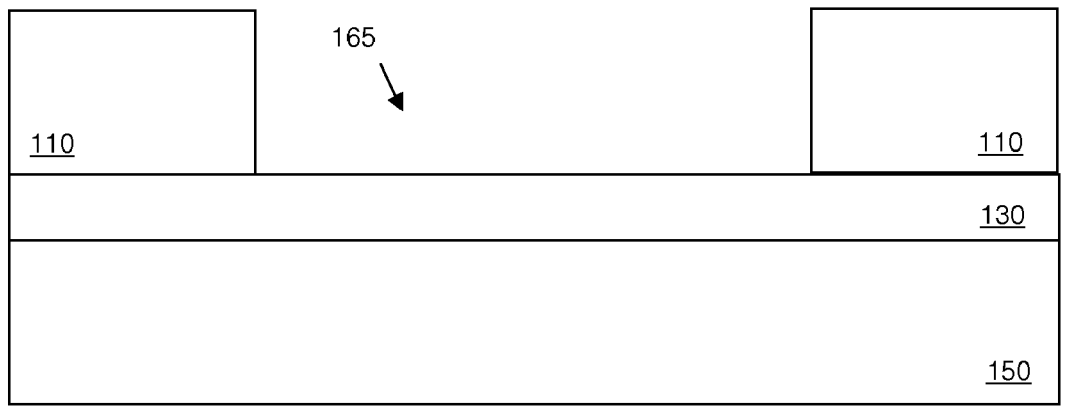
FIG. 4 is a schematic diagram illustrating a partially completed semiconductor structure of FIG. 1.
Figure 5:
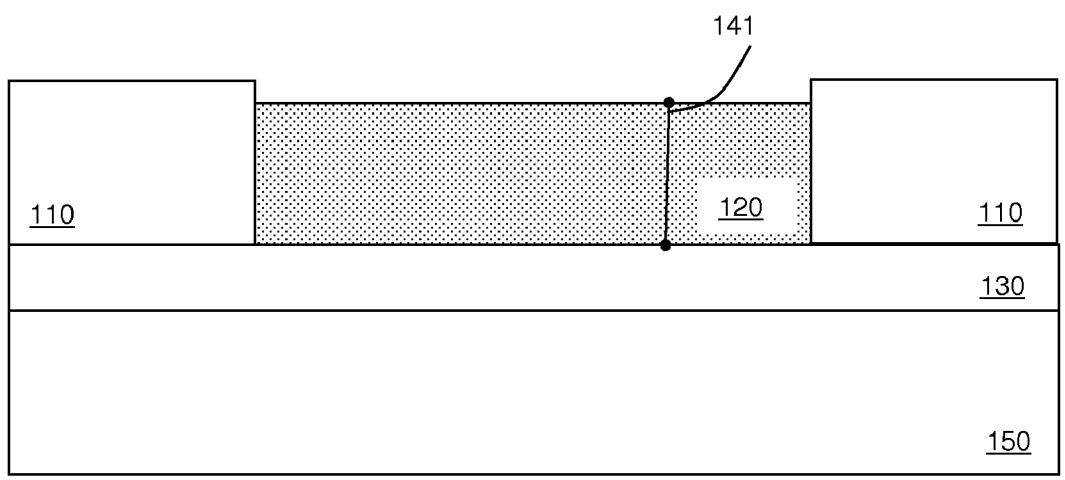
FIG. 5 is a schematic diagram illustrating a partially completed semiconductor structure of FIG. 1.

Referring to FIG. 2, also disclosed is an embodiment of a method of forming the semiconductor structure 100 of FIG. 1, described above. This embodiment comprises providing a substrate 150, e.g., a semiconductor wafer (202) and forming an insulator layer 130 on the substrate 150 (204, see FIG. 3). A first film 110 is formed on the insulator layer 130 (206). This first film 110 can comprise a first material, for example, a single crystalline semiconductor material such as silicon (Si). Thus, the first film 110 can correspond to a device region of the semiconductor structure 100 of FIG. 1. A second film 120, comprising a second material that is different from the first material, is also formed on the insulator layer 130 adjacent to the first film 110 (208, see FIGS. 4-5). The second material can comprise an isolation material (e.g., an oxide and/or nitride material) and can, for example, comprise the same dielectric material as the insulator layer 130 (e.g., silicon dioxide). Thus, the second film 120 can correspond to an isolation region (e.g., a shallow trench isolation region) of the semiconductor structure 100 of FIG. 1. As illustrated in FIG. 1, the second film 120 is specifically formed with a first section 121 having a first thickness 141 and a second section 122 having a second thickness 142 that is different from the first thickness 141 (210).

Figure 3:
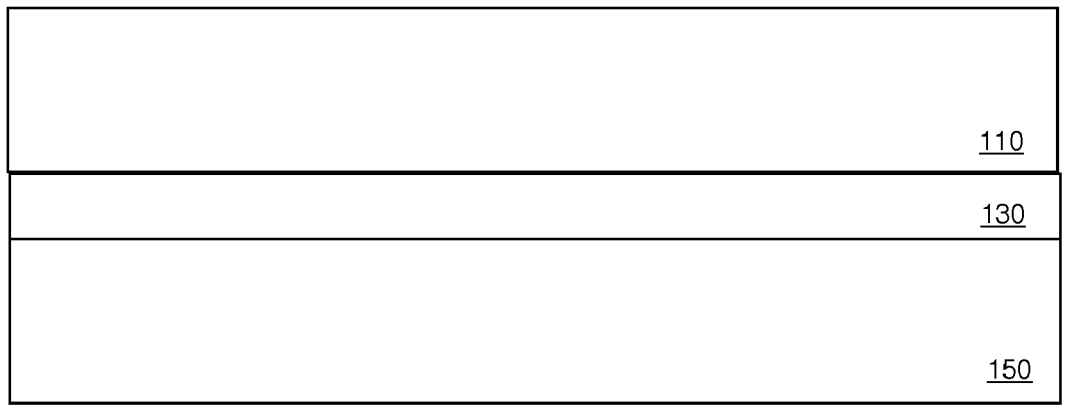
FIG. 3 is a schematic diagram illustrating a partially completed semiconductor structure of FIG. 1.

Forming the adjacent first and second films above the insulator layer can be accomplished at process 206-208, for example, by depositing the first material on the insulator layer 130 (see FIG. 3). A trench 165 is formed (e.g., lithographically patterned and etched) through the first material 110 to expose a portion of the insulator layer 130 (see FIG. 4). Next, the second material is deposited and planarized, filling the trench 165 such that the second film 120 is formed on the insulator layer 130 and is positioned laterally adjacent to the first film 110 (see FIG. 5).

Prior to formation of the semiconductor structure 100, the desired first and second thicknesses 141, 142 of the first and second sections 121, 122, respectively, of the second film 120 (i.e., a shallow trench isolation region) are predetermined so as to selectively control the reflectance and absorption characteristics in an area of the first film 110 that will contain first device(s) 111 and that is adjacent to the first section 121 of the STI 120 and to also selectively control reflectance and absorption characteristics in an area of the first film 110 that will contain second device(s) 112 and that is adjacent to the second section 122 of the STI 120. Specifically, the first and second thicknesses 141, 142 are predetermined so that subsequently formed first device(s) 111 in the first film 110 adjacent to the first section 121 of the second film 120 and subsequently formed second device(s) 112 in the first film 110 adjacent to the second section 122 of the second film 120 will be able to achieve a predetermined maximum temperature during a rapid thermal anneal. This maximum temperature can be predetermined so that optimal dopant activation temperatures are achieved and/or so that the devices will exhibit predetermined performance characteristics following such a rapid thermal anneal. See discussions below regarding device formation at process 212 and RTA at process 214.

Figure 6:
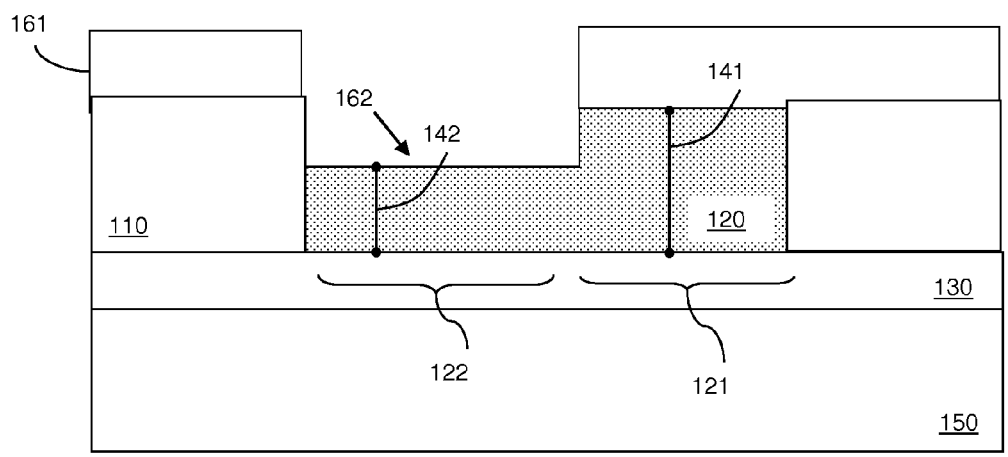
FIG. 6 is a schematic diagram illustrating a partially completed semiconductor structure of FIG. 1.

At process 210, the thickness of different sections 121, 122 of the second film 120 deposited into the trench 165 (see FIG. 3) are selectively adjusted in order to form the second film 120 with the first section 121 having the first thickness 141 and the second section 122 having the second thickness 142. More specifically, after depositing the second material into the trench 165, the film 120 can be planarized and the first film 110, the second film 120 or neither can be selectively etched back, as necessary, to achieve the desired first thickness 141. Then, a photoresist layer 161 can be deposited over the structure and lithographically patterned to expose a portion 162 of the second film 120. Next, the exposed portion 162 of the second film 120 can be etched back to the desired second thickness 142 (see FIG. 6). Although FIG. 6 illustrates both the first thickness 141 of the first section 121 of the second film 120 and the second thicknesses 142 of the second section 122 of the second film 120 as being less than the thickness of the first film 110, it is anticipated and those skilled in the art will recognize that, due to the method steps described above, either one or both of these thicknesses 141, 142 may be the same or greater than that of the first film 110.

Following formation of the first and second films 110, 120 above the insulator layer 130 at processes 204-210, described above, at least one first device 111 can be formed in the first film 110 adjacent to the first section 121 of the second film 120 and at least one second device 112 can be formed in the first film 110 adjacent to the second section 122 of the second film 120 (212).

Following device formation at process 212, a conventional rapid thermal anneal (RTA) process can be performed (214). The different predetermined thicknesses 141, 142 of the STI 120 are used to selectively control the reflectance and absorption characteristics exhibited across the wafer during this RTA process and, thus, the maximum achievable anneal temperature for a given single rapid thermal anneal process (216) (e.g., so that predetermined dopant activation temperatures can be achieved in the different devices 111, 112 during the anneal (217) and/or so that predetermined performance characteristics will be exhibited by the devices 111, 112 after the anneal (218).

While the structure 100 and associated method embodiments described above refer to the STI 120 as having only two sections with different thicknesses, it is anticipated that the STI 120 may be formed with many sections having different thicknesses so as to control the reflectance and absorption characteristics in many different areas of the device region 110.

Figure 7:
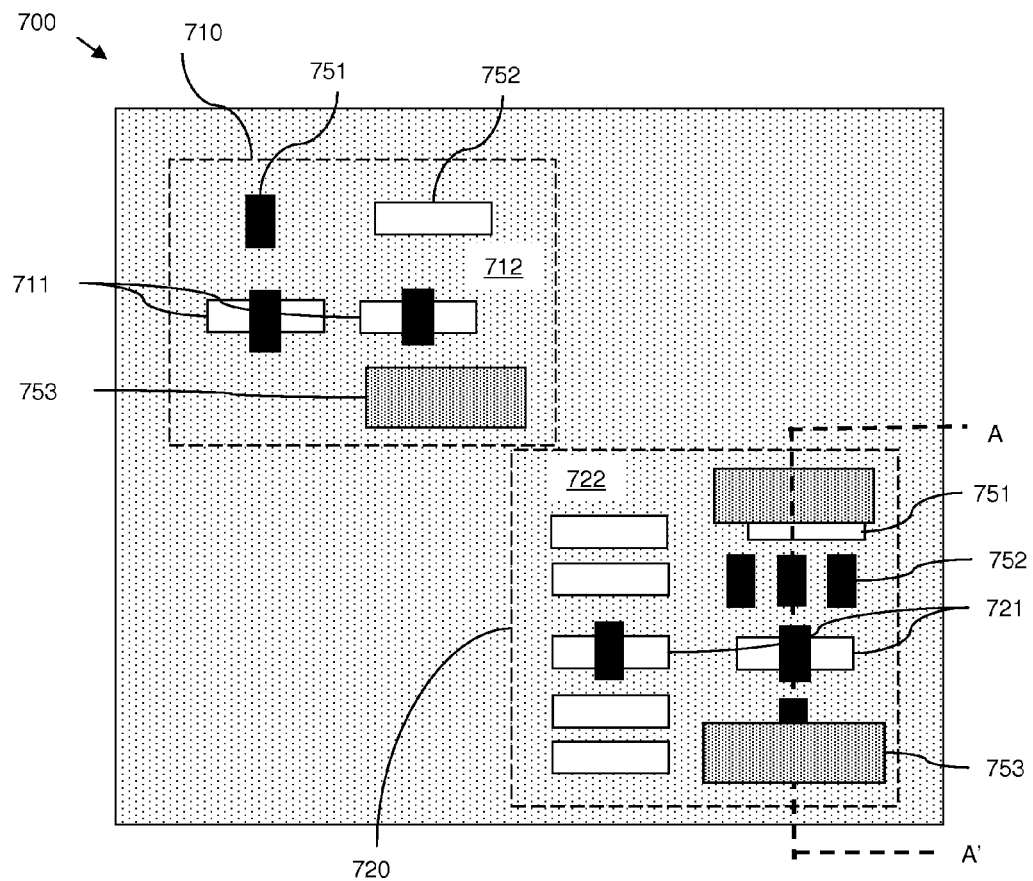
FIG. 7 is a schematic diagram illustrating another embodiment of a semiconductor structure of the invention.
Figure 8:
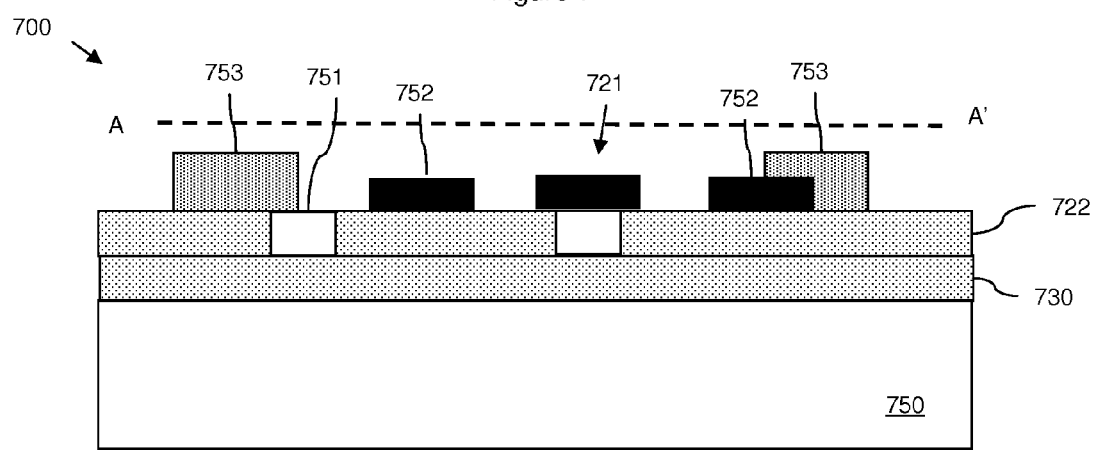
FIG. 8 is a schematic diagram illustrating an A-A' cross-section view of the semiconductor structure of FIG. 7.

Referring to FIGS. 7 and 8 in combination, another embodiment the semiconductor structure 700 comprises a substrate 750 and first and second sections 710, 720 adjacent to each other above the substrate 750. The first section 710 comprises at least one first device 711 and a first isolation region 712 (e.g., a shallow trench isolation region (STI) comprising an isolation material (e.g., silicon dioxide)) adjacent to the first device(s) 711. The second section 720 similarly comprises at least one second device 721 and a second isolation region 722 (e.g., a shallow trench isolation region (STI) comprising the same isolation material as the first isolation region 712) adjacent to the second device(s) 721.

Both sections 710, 720 also comprise a plurality of fill structures 751-753 that are positioned in predetermined patterns (i.e., a first pattern in the first section and a second pattern in the second section) both horizontally and vertically adjacent to their respective isolation regions 712, 722 so that only predetermined amounts of the isolation material of the isolation regions 712, 722 are exposed. The predetermined patterns refer to the types, quantities, densities and locations of the fill structures 751-753 within the sections 710, 720. These fill structures can comprise, for example, single crystalline semiconductor structures (e.g., silicon structures, such as dummy device structures 751) positioned laterally adjacent to the first and second isolation regions 712, 722. They can comprise polycrystalline semiconductor structures (e.g., polysilicon structures, such as dummy polysilicon gate structures 752) positioned above the first and second isolation regions 712, 722, and/or above the dummy devices 751.

Finally, they can comprise dielectric structures (e.g., oxide structures, nitride structures, oxide-nitride stacks, etc.) positioned above the first and second isolation regions 712, 722, above the dummy devices 751 and/or above the dummy gate structures 752.

The first pattern of the fill structures 751-753 in the first section 710 can be predetermined so that a predetermined first amount of the isolation material of the first isolation region 712 is exposed. Similarly, the second pattern of the fill structures 751-753 in the second section 720 can be predetermined so that a predetermined second amount of the isolation material of the second isolation region 722 is exposed. For example, as illustrated in FIG. 7, the pattern of fill structures 751-752 in the first section 710 exposes significantly more of the isolation material in the isolation region, than does the pattern of fill structures 751-753 in the second section 720. Selectively varying the fill structure patterns in the different section 710, 720 will vary the amount of STI 712, 722 exposed in each section and thus the reflectance and absorption characteristics of the different sections 710, 720. This in turn will vary the anneal temperatures experienced by the devices 711, 721 in those sections. Those skilled in the will recognize that a section 710 with a greater amount of exposed STI material will reflect more heat during a rapid thermal anneal and, thus, may not reach the same temperature during an RTA than a different section 720 with less exposed STI material. Therefore, by varying the amount of STI material exposed in the different sections, dopant activation temperatures can be optimized for devices 711, 721 in the different sections 710, 720 and/or desired performance characteristics can be achieved for devices 711, 721 in the different sections 710, 720.

Specifically, the first amount of the isolation material of the first isolation region 712 that is exposed in the section 710 and the second amount of the isolation material of the second isolation region 722 that is exposed in the second section 720 can each be predetermined so that the first device(s) 711 and the second device(s) 721 can achieve predetermined maximum temperatures in response to a given single rapid thermal anneal process. For example, it is well-known in the art that different dopants (e.g., n-type dopants such as phosphorous (P), antimony (Sb), and arsenic (As) and p-type dopants such as boron (B)) have different activation temperatures. Therefore, to optimize the dopant activation, the fill structure patterns in the different sections 710, 720 containing the devices 711, 721, respectively, can be selectively varied.

Alternatively or additionally, the different patterns can be predetermined so that the first device(s) 711 and the second device(s) 721 will exhibit predetermined performance characteristics following a rapid thermal anneal. For example, it is well known that different anneal temperatures can cause devices to exhibit different threshold voltages, sheet resistances, drive currents, leakage currents, etc. Therefore, in order to selectively control the performance characteristics (e.g., the threshold voltages, sheet resistances, drive currents, leakage currents, etc. of different devices) of different devices 711, 721, the fill structure patterns in the different sections 710, 720 that contain the devices can be selectively varied.

Figure 9:
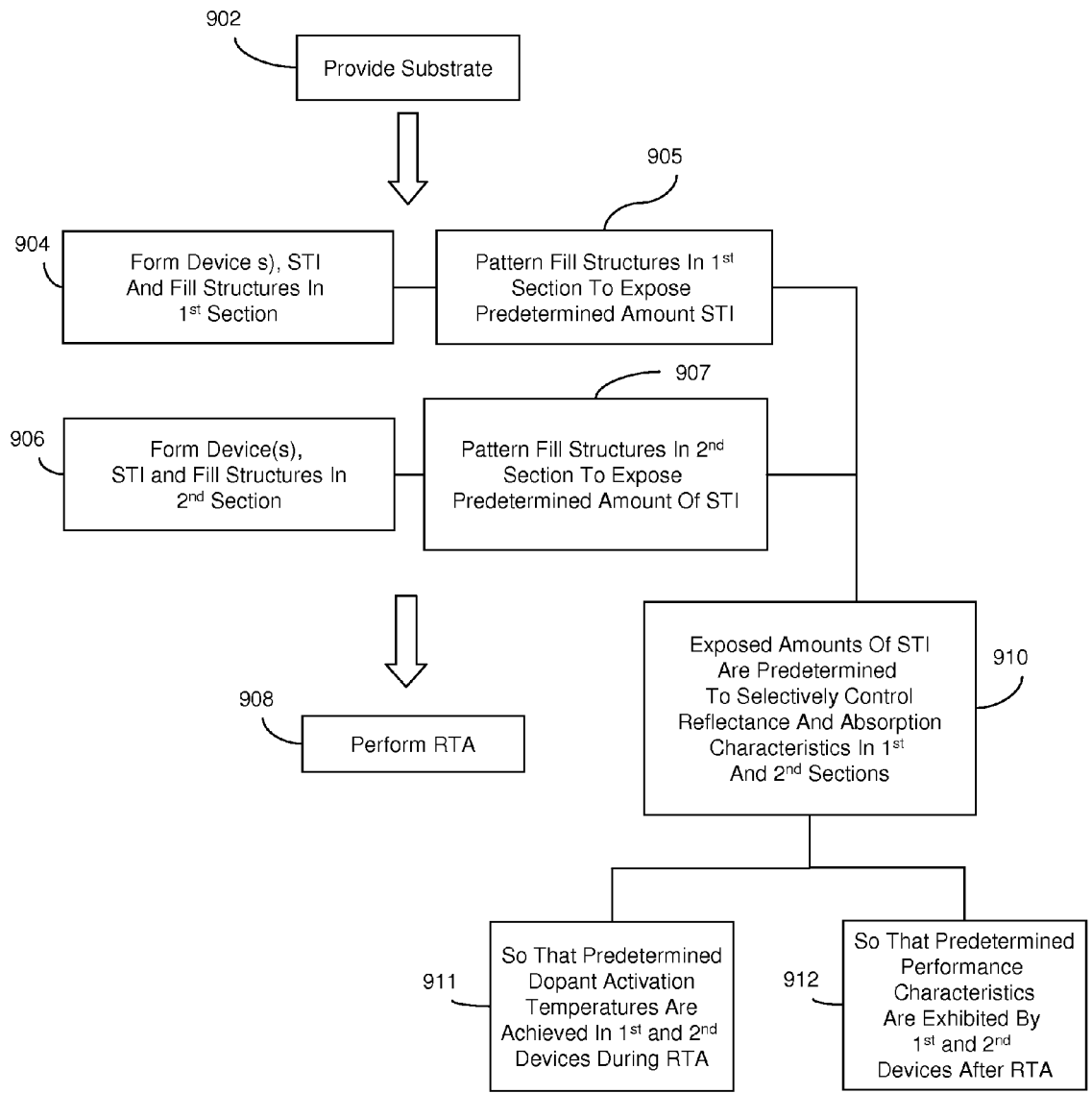
FIG. 9 is a schematic diagram illustrating an embodiment of a method of forming the semiconductor structure of FIG. 7.

Referring to FIG. 9 in combination with FIGS. 7-8, also disclosed is an embodiment of a method of forming the semiconductor structure 700, described above. This embodiment comprises providing a substrate 750 (e.g., a semiconductor wafer) (902) and forming an isolation layer 730 on the substrate 750. Then, device and isolation regions are formed above the isolation layer 730 (904-907). Particularly, a first section 710 is formed with at least one first device 711 and a first isolation region 712 adjacent to the first device(s) 711. A second section 720 is also formed with at least one second device 721 and a second isolation region 722 adjacent to the second device(s) 721.

Fill structures 751-753 are also formed in the first and second sections 710, 720 horizontally and vertically adjacent to the first and second isolation regions 712, 722. Specifically, the fill structures 751-753 can be formed in each of the sections 710, 720 and can be formed in predetermined patterns (i.e., a first pattern in the first section 710 and a second pattern in the second section 720) in order to selectively control the reflectance and absorption characteristics of the sections 710, 720. These predetermined patterns refer to the types, quantities, densities and locations of the fill structures 751-753 within the sections 710, 720 (910)

Specifically, the first and second patterns can be predetermined so that a predetermined first amount of the isolation material in the first isolation region 712 of the first section 710 will be exposed (905) and similarly so that a predetermined second amount of the isolation material in the second isolation region 722 of the second section 720 will be exposed (907). The first and second amounts of exposed isolation material in the first and second sections 710, 720, respectively, can be predetermined so that the first and second devices 711, 721 will achieve different maximum anneal temperatures during a given single anneal process (908) (e.g., in order to achieve optimal dopant activation temperatures during the RTA (911) and/or so that the first and second devices 711, 721 will exhibit the same or different predetermined performance characteristics, such as different threshold voltages, following the RTA (912)).

This embodiment of the method, as described above, illustrates the fill structures 751-753 being formed such that the first and second patterns are achieved in the first and second sections 710, 720, respectively. However, alternatively, a generic wafer can be formed with a surplus of fill structures throughout the wafer. Then, specific fill structures can be selectively removed from different sections of the wafer (i.e., from first and second sections 710, 720) in order to achieve the predetermined first and second patterns at process 904-907. If a generic wafer with a surplus of fill structures 751-753 is used, but not enough fill structures are present in a particular section, additional fill structures can also be formed, as necessary, in order to achieve the predetermined first and second patterns.

Fill structures 751 can be formed by forming single crystalline semiconductor structures (e.g., silicon structures, such as dummy devices) so that they are positioned laterally adjacent to the first and second isolation regions 712, 722 in the first and second sections 710, 720, respectively. Fill structures 752 can also be formed by forming polycrystalline semiconductor structures (e.g., polysilicon structures, such as dummy polysilicon gate structures) above the first and second isolation regions 712, 722 and/or above the dummy devices 751 in the first and second sections 710, 720, respectively. Finally, fill structures 753 can also be formed by forming dielectric structures (e.g., by depositing and patterning an oxide layer, a nitride layer, an oxide-nitride stack, etc.) above the first and second isolation regions 712, 722, above the dummy devices 751 and/or above the dummy gate structure 752 in the first and second sections 710, 720, respectively. Thus, these fill structures 751-753 can be formed using conventional processing techniques for device formation, gate formation, nitride block formation, nitride stress memorization layer formation, etc.

While the structure 700 and associated method embodiments described above refer to the two different sections of the structure having different patterns of fill structures, it is anticipated that the structure 700 may be formed with many sections having different fill structure patterns so as to selectively control the reflectance and absorption characteristics within those sections.

Therefore, disclosed above are embodiments of a semiconductor structure and method of forming the structure with selectively adjusted reflectance and absorption characteristics in order to selectively control temperature changes during a rapid thermal anneal and, thereby, to selectively control variations in device performance (e.g., to form devices with different threshold voltages (Vt) in different regions on the same wafer) and/or to selectively optimize the anneal temperature of such devices (e.g., to ensure optimal activation temperatures for n-type and p-type dopants during anneals). Selectively controlling the temperature changes in different devices during a rapid thermal anneal can be accomplished by selectively varying the isolation material thickness in different sections of a shallow trench isolation structures (e.g., in sections that are adjacent to different devices). Alternatively, it can be accomplished by selectively varying the pattern of fill structures in different sections of a semiconductor wafer so that predetermined amounts of shallow trench isolation regions in the different sections are exposed.

Benefits that flow from this invention include reduced manufacturing cost by allowing for a plurality of device characteristics without adding process steps, and increased flexibility in circuit design, enabling reduced time to market. Furthermore, integrated circuits with lower operating and standby power, and higher speed are enabled by the art taught herein.

It should be noted that the inventors of the above embodiments have invented the following additional inventions related to the reflectance and absorption characteristics of wafers during rapid thermal anneals, each of which is being filed simultaneously herewith and is fully incorporated herein by reference: (1) co-filed U.S. patent application Ser. No. 11/678,783, titled "Localized Temperature Control During Rapid Thermal Anneal"; (2) co-filed U.S. patent application Ser. No. 11/678,745, titled "Structure And Method For Device-Specific Fill For Improved Anneal Uniformity"; and (3) co-filed U.S. patent application Ser. No. 11/678,756, titled "Semiconductor Wafer Structure With Balanced Reflectance And Absorption Characteristics For Rapid Thermal Anneal Uniformity".

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, those skilled in the art will recognize that the embodiments of the invention can be practiced with modification within the spirit and scope of the appended claims.

What is claimed is:

1. A semiconductor structure comprising:
    a substrate;
    an insulator layer on said substrate, said insulator layer covering said substrate and having a top surface;
    a first film above and in contact with said top surface of said insulator layer, wherein said first film comprises a first material; and
    a trench isolation region comprising:
        a trench extending vertically through said first film to said top surface of said insulator layer and separating said first film into a first portion and a second portion; and
        a second film within said trench above and in contact with said top surface of said insulator layer, wherein said second film extends laterally from said first portion of said first film to said second portion of said first film, wherein said second film comprises a second material that is different from said first material, and wherein said second film comprises a first section in contact with said first portion of said first film and having a first thickness and a second section in contact with said second portion of said first film and having a second thickness that is different from said first thickness, said first thickness and said second thickness being predetermined such that said first portion of said first film exhibits first reflectance and absorption characteristics and said second portion of said first film exhibits second reflectance and absorption characteristics that are selectively different from said first reflectance and absorption characteristics.

2. The semiconductor structure of claim 1, wherein said first thickness and said second thickness are each predetermined such that variations in reflectance and absorption characteristics between said first portion of said first film and said first section of said second film and between said second portion of said first film and said second section of said second film are selectively controlled.

3. The semiconductor structure of claim 1, further comprising:
    a first device in said first portion of said first film adjacent to said first section of said second film and a second device in said second portion of said first film adjacent to said second section of said second film,
    wherein said first thickness of said first section of said second film and said second thickness of said second section of said second film are predetermined such that said first device and said second device achieve predetermined maximum temperatures during a single rapid thermal anneal.

4. The semiconductor structure of claim 3,
    wherein said first thickness and said second thickness are further predetermined such that said first device and said second device exhibit predetermined performance characteristics following said single rapid thermal anneal.

5. The semiconductor structure of claim 1, wherein said first material comprises a semiconductor and said second material comprises an isolation material.

6. The semiconductor structure of claim 1, wherein said second material and said insulator layer comprise a same dielectric material.

7. A method of forming a semiconductor structure, said method comprising:
    providing a substrate;
    forming an insulator layer on said substrate such that said insulator layer covers said substrate and has a top surface, said top surface being essentially planar and continuous;
    forming a first film, comprising a first material, above and in contact with said insulator layer; and
    forming a trench isolation region in said first film, said forming of said trench isolation region comprising:
        forming a trench that extends vertically through said first film to said top surface of said insulator layer, separating said first film into a first portion and a second portion;
        forming, within said trench, a second film, comprising a second material that is different from said first material, such that said second film is above and in contact with said insulator layer, such that said second film extends laterally from said first portion of said first film to said second portion of said first film and further such that said second film comprises a first section in contact with said first portion of said first film and having a first thickness and a second section in contact with said second portion of said first film and having a second thickness that is different from said first thickness, said first thickness and said second thickness being predetermined such that said first portion of said first film exhibits first reflectance and absorption characteristics and said second portion of said first film exhibits second reflectance and absorption characteristics that are selectively different from said first reflectance and absorption characteristics.

8. The method of claim 7, said forming, within said trench, of said second film such that said second film comprises said first section in contact with said first portion of said first film and having said first thickness and said second section in contact with said second portion of said first film and having said second thickness that is different from said first thickness comprises:
   depositing said second material in said trench such that said second film is formed on said insulator layer between said first portion and said second portion of said first film and such that said second film has said first thickness;
   depositing a photoresist layer on said first film and said second film;
   patterning said photoresist layer to expose said second section of said second film, leaving said first section masked; and
   etching back said second section of said second film such that said second section has said second thickness.

9. The method of claim 6, wherein said method further comprises:
   forming a first device in said first portion of said first film adjacent to said first section of said second film and a second device in said second portion of said first film adjacent to said second section of said second film; and
   predetermining said first thickness of said first section and said second thickness of said second section so as to selectively control variations in reflectance and absorption characteristics between said first portion of said first film and said first section of said second film and between said second portion of said first film and said second section of said second film.

10. The method of claim 9, further comprising predetermining said first thickness and said second thickness such that said first device and said second device achieve predetermined maximum temperatures during a single rapid thermal anneal.

11. The method of claim 9, further comprising predetermining said first thickness and said second thickness such that said first device and said second device exhibit predetermined performance characteristics following a single rapid thermal anneal.

12. The method of claim 7, wherein said first material comprises a semiconductor and said second material comprises an isolation material.

13. The method of claim 8, wherein said second material and said insulator layer comprise a same dielectric material.

14. A semiconductor structure comprising:
   a substrate;
   an insulator layer above and in contact with said substrate;
   a semiconductor layer above and in contact with said insulator layer, said semiconductor layer comprising:
      a first section comprising at least one first device and a second section comprising at least one second device;
   a first trench isolation region extending vertically through said semiconductor layer in said first section, said first isolation region positioned laterally adjacent to said first device;
   a second trench isolation region extending vertically through said semiconductor layer in said second section, said second isolation region positioned laterally adjacent to said second device; and
   a plurality of fill structures adjacent to said first isolation region and said second isolation region,
      wherein a first pattern of said fill structures in said first section is such that a first amount of an isolation material in said first trench isolation region is exposed,
      wherein a second pattern of said fill structures in said second section is such that a second amount of said isolation material in said second trench isolation region is exposed, said first pattern being different from said second pattern and said first amount being different from said second amount, and
      wherein said fill structures comprise at least one of the following:
         single crystalline semiconductor structures within and at a top surface of at least one of said first trench isolation region and said second trench isolation region; and
         polycrystalline semiconductor structures above and in contact with at least a portion of at least one of said first trench isolation region and said second trench isolation region.

15. The semiconductor structure of claim 14, wherein said single crystalline semiconductor structures comprise a silicon material and wherein said polycrystalline semiconductor structures comprise a polysilicon material.

16. The semiconductor structure of claim 14, wherein said dielectric structures comprises one of an oxide material, a nitride material and an oxide-nitride stack.

17. The semiconductor structure of claim 14, wherein said first amount of said isolation material exposed in said first section and said second amount of said isolation material exposed in said second section are such that said first device and said second device achieve predetermined maximum temperatures during a single rapid thermal anneal.

18. The semiconductor structure of claim 17, wherein said predetermined maximum temperatures achieved by said first device and said second device are different dopant activation temperatures.

19. The semiconductor structure of claim 14, wherein said first amount of said isolation material exposed in said first section and said second amount of said isolation material exposed in said second section are each such that said first device and said second device exhibit predetermined performance characteristics following a single rapid thermal anneal.

20. The semiconductor structure of claim 14, said fill structures further comprising dielectric structures above and in contact with any one of said first isolation region, said second isolation region, a single crystalline semiconductor structure and a polycrystalline semiconductor structure.

* * * * *